United States Patent [19]

Higashiho

[11] Patent Number: 5,701,096
[45] Date of Patent: Dec. 23, 1997

[54] CHARGE-PUMP TYPE BOOSTER CIRCUIT

[75] Inventor: Mitsuhiro Higashiho, Kasugai, Japan

[73] Assignee: Fujitsu Limited, Kawasaki, Japan

[21] Appl. No.: 521,439

[22] Filed: Aug. 30, 1995

[30] Foreign Application Priority Data

Dec. 9, 1994 [JP] Japan .................. 6-306485

[51] Int. Cl.⁶ ............................................. G05F 1/10
[52] U.S. Cl. ............................... 327/536; 327/537
[58] Field of Search ........................... 327/536, 537, 327/589; 365/226

[56] References Cited

U.S. PATENT DOCUMENTS

| | | | |
|---|---|---|---|
| 4,455,493 | 6/1984 | Morton et al. | 327/536 |
| 4,740,715 | 4/1988 | Okada | 327/536 |
| 5,038,325 | 8/1991 | Douglas et al. | 327/536 |
| 5,126,590 | 6/1992 | Chern | 327/537 |
| 5,266,842 | 11/1993 | Park | 327/537 |
| 5,343,088 | 8/1994 | Jeon | 327/537 |
| 5,347,171 | 9/1994 | Cordoba et al. | 327/537 |
| 5,524,266 | 6/1996 | Tedrow et al. | 395/800 |

OTHER PUBLICATIONS

T. Suzuki et al., "High–Speed Circuit Techniques for Battery–Operated 16 Mbit CMOS DRAM", IEICE Trans. Electron, vol. E77–C, No. 8, Aug. 1994, pp. 1334–1341.

Primary Examiner—Timothy P. Callahan
Assistant Examiner—Jung Ho Kim
Attorney, Agent, or Firm—Armstrong, Westerman, Hattori, McLeland & Naughton

[57] ABSTRACT

A charge-pump type booster circuit has a first capacitor, a power source applying unit, a transfer gate, a second capacitor, a switching unit, and a precharge circuit. The first capacitor is used to boost an output voltage, the power source applying unit is used to apply a first power supply voltage to an output terminal of the first capacitor. The transfer gate is used to transfer the boosted output voltage, and the second capacitor is used to boost a gate voltage of the transfer gate. The switching unit is used to control an input voltage of the second capacitor, and the precharge circuit is used to apply a specific high voltage to a control terminal of the transfer gate. Therefore, a sufficient high-voltage output (super-high power supply voltage) can be surely generated by using a low voltage (general high power supply voltage).

33 Claims, 7 Drawing Sheets

Fig. 7

CHARGE-PUMP TYPE BOOSTER CIRCUIT

BACKGROUND OF THE INVENTION

1. Field of the Invention

The present invention relates to a semiconductor integrated circuit, and more particularly, to a charge-pump type booster circuit for generating a super-high power source voltage (Vpp) by using a general high power supply voltage (Vcc).

2. Description of the Related Art

Recently, personal computers and word processors have become wide spread. In particular, battery-operated portable equipment (for example, note-book-type portable computers) have been required and marketed.

Note that, a power supply voltage (general high power supply voltage Vcc) of the battery-operated portable equipment is, for example, 3 volts, but dynamic random access memory (DRAM) included in the battery-operated portable equipment must be driven by a super-high power source voltage (Vpp: for example, 5 volts or 6 volts) in order to realize a high-speed operation. Namely, in the battery-operated portable equipment, a booster circuit for increasing a potential of the general high power supply voltage Vcc to the super-high power source voltage Vpp must be provided.

In recent years, a charge-pump type booster circuit has been used in various semiconductor devices (for example, DRAMs, EPROMs, and the like), which are, for example, provided in battery-operated portable equipment. However, in the conventional charge-pump type booster circuit, a transfer gate for outputting a boosted voltage (output voltage Vpp) is constituted by an N-channel type MOS transistor, and the gate potential of the transfer gate must be greater than the sum of the output voltage (Vpp) and the threshold voltage (Vth) of the transfer gate (gate transistor). However, the threshold voltage Vth of the gate transistor rises in response to an increase in the output voltage of the booster circuit, that is, the threshold voltage Vth is changed by a back-gate effect of the gate transistor.

Consequently, the output voltage Vpp of the charge-pump type booster circuit, which is changed in response to the threshold voltage Vth of the transistor, may not be sufficiently boosted to a required voltage (super-high power source voltage Vpp).

In the prior art, a charge-pump type booster circuit is disclosed in, for example, "High-Speed Circuit Techniques for Battery-Operated 16 Mbit CMOS DRAM", T. Suzuki, et al., IEICE TRANS. ELECTRON., Vol. E77-C, No. 8, August 1994. In this document, circuit techniques for realizing fast cycle time of DRAM are described. Further, a booster circuit described in the above document has capacitors and a transfer gate, to provide an increased voltage of Vpp (e.g., 2 Vcc) according to an input voltage (general high power supply voltage) Vcc.

The problems of the prior art booster circuit (charge-pump type booster circuit) will be explained in detail with reference to the accompanying drawings.

SUMMARY OF THE INVENTION

An object of the present invention is to provide a charge-pump type booster circuit capable of providing a sufficient high-voltage output (super-high power supply voltage Vpp) with the use of a low voltage (general high power supply voltage Vcc). Further, another object of the present invention is to provide a charge-pump type booster circuit for preventing an unwanted current.

According to the present invention, there is provided a charge-pump type booster circuit comprising a first capacitor for boosting an output voltage, a power source applying unit for applying a first power supply voltage to an output terminal of the first capacitor, a transfer gate for transferring the boosted output voltage, a second capacitor for boosting a gate voltage of the transfer gate, a switching unit for controlling an input voltage of the second capacitor, and a precharge circuit for applying a specific high voltage to a control terminal of the transfer gate.

Further, according to the present invention, there is provided a charge-pump type booster circuit comprising an input terminal for receiving a first signal; an output terminal for outputting a boosted output voltage; a first capacitor having a first terminal and a second terminal, for storing charges and boosting an output voltage, the first terminal of the first capacitor being connected to the input terminal; a transfer gate having a first terminal, a second terminal, and a control terminal, for transferring the boosted output voltage to the output terminal, the first terminal of the transfer gate being connected to the second terminal of the first capacitor, and the second terminal of the transfer gate being connected to the output terminal; a power source applying unit, connected between a first power supply line and the first terminal of the transfer gate, for applying a first power supply voltage to the first terminal of the transfer gate; a second capacitor having a first terminal and a second terminal, for storing charges and boosting a gate voltage of the transfer gate, the first terminal of the second capacitor being connected to the second terminal of the first capacitor and the second terminal of the second capacitor being connected to the control terminal of the transfer gate; a switching unit having a first terminal, a second terminal, and a control terminal, the first terminal of the switching unit being connected to the first terminal of the second capacitor, the second terminal of the switching unit being connected to a second power supply line, and the control terminal of the switching unit being supplied with a second signal and; a precharge circuit, connected to the control terminal of the transfer gate, for applying a specific high voltage to the control terminal of the transfer gate when the transfer gate being switched OFF.

The precharge circuit may comprise a precharge transistor having a first terminal, a second terminal, and a control terminal, the first terminal of the precharge transistor being connected to a specific high voltage line, the second terminal of the precharge transistor being connected to the control terminal of the transfer gate; and a precharge control unit, connected to the control terminal of the precharge transistor, for controlling a switching operation of the precharge transistor. The precharge control unit may comprise a level converter.

The booster circuit may further comprise a control unit connected between the second terminal of the first capacitor and the first terminal of the second capacitor. The control unit may comprise a P-channel type MOS transistor having a first terminal, a second terminal, and a control terminal, the first terminal of the transistor being connected to the second terminal of the first capacitor, the second terminal of the transistor being connected to the second power supply line, and the control terminal of the transistor being connected to the first power supply line.

The specific high voltage applied to the control terminal of the transfer gate may be a voltage of the first power supply line or the highest internal power source voltage. Each of the first and second capacitors may comprise an N-channel type MOS transistor, the first terminal of the first capacitor may be constituted by a source electrode and a drain electrode of the MOS transistor, and the second terminal of the first capacitor may be constituted by a gate electrode of the MOS transistor. The first signal supplied to the input terminal may be a clock signal, and the second signal supplied to the control terminal of the switching unit may be an inverted signal of the clock signal.

The booster circuit may further comprise a floating prevention unit for keeping charges and preventing a floating state at the control terminal of the transfer gate. The floating prevention unit may comprise an N-channel type MOS transistor having a first terminal, a second terminal, and a control terminal, the first terminal and the control terminal of the floating prevention unit being connected to a high power supply line, and the second terminal of the floating prevention unit being connected to the control terminal of the transfer gate.

Further, according to the present invention, there is also provided a charge-pump type booster circuit having a first and second booster unit, each of the first and second booster unit comprising an input terminal for receiving a first signal; an output terminal for outputting a boosted output voltage; a first capacitor having a first terminal and a second terminal, for storing charges and boosting an output voltage, the first terminal of the first capacitor being connected to the input terminal; a transfer gate having a first terminal, a second terminal, and a control terminal, for transferring the boosted output voltage to the output terminal, the first terminal of the transfer gate being connected to the second terminal of the first capacitor, and the second terminal of the transfer gate being connected to the output terminal; a power source applying unit, connected between a first power supply line and the first terminal of the transfer gate, for applying a first power supply voltage to the first terminal of the transfer gate; a second capacitor having a first terminal and a second terminal, for storing charges and boosting a gate voltage of the transfer gate, the first terminal of the second capacitor being connected to the second terminal of the first capacitor and the second terminal of the second capacitor being connected to the control terminal of the transfer gate; a switching unit having a first terminal, a second terminal, and a control terminal, the first terminal of the switching unit being connected to the first terminal of the second capacitor, the second terminal of the switching unit being connected to a second power supply line, and the control terminal of the switching unit being supplied with a second signal and; a precharge circuit, connected to the control terminal of the transfer gate, for applying a specific high voltage to the control terminal of the transfer gate when the transfer gate being switched OFF, wherein the precharge circuit of the first booster unit is controlled by a voltage of the first terminal of the transfer gate of the second booster unit, the precharge circuit of the second booster unit is controlled by a voltage of the first terminal of the transfer gate of the first booster unit.

In addition, according to the present invention, there is provided a semiconductor memory having an address decoder, a row decoder, a column decoder, a memory cell array, and a booster circuit for generating a boosted output voltage, wherein the booster circuit comprises an input terminal for receiving a first signal; an output terminal for outputting a boosted output voltage; a first capacitor having a first terminal and a second terminal, for storing charges and boosting an output voltage, the first terminal of the first capacitor being connected to the input terminal; a transfer gate having a first terminal, a second terminal, and a control terminal, for transferring the boosted output voltage to the output terminal, the first terminal of the transfer gate being connected to the second terminal of the first capacitor, and the second terminal of the transfer gate being connected to the output terminal; a power source applying unit, connected between a first power supply line and the first terminal of the transfer gate, for applying a first power supply voltage to the first terminal of the transfer gate; a second capacitor having a first terminal and a second terminal, for storing charges and boosting a gate voltage of the transfer gate, the first terminal of the second capacitor being connected to the second terminal of the first capacitor and the second terminal of the second capacitor being connected to the control terminal of the transfer gate; a switching unit having a first terminal, a second terminal, and a control terminal, the first terminal of the switching unit being connected to the first terminal of the second capacitor, the second terminal of the switching unit being connected to a second power supply line, and the control terminal of the switching unit being supplied with a second signal and; a precharge circuit, connected to the control terminal of the transfer gate, for applying a specific high voltage to the control terminal of the transfer gate when the transfer gate is switched OFF.

Further, according to the present invention, there is also provided a semiconductor memory having an address decoder, a row decoder, a column decoder, a memory cell array, and a booster circuit for generating a boosted output voltage, wherein the booster circuit includes a first and second booster unit, each of the first and second booster units comprising an input terminal for receiving a first signal; an output terminal for outputting a boosted output voltage; a first capacitor having a first terminal and a second terminal, for storing charges and boosting an output voltage, the first terminal of the first capacitor being connected to the input terminal; a transfer gate having a first terminal, a second terminal, and a control terminal, for transferring the boosted output voltage to the output terminal, the first terminal of the transfer gate being connected to the second terminal of the first capacitor, and the second terminal of the transfer gate being connected to the output terminal; a power source applying unit, connected between a first power supply line and the first terminal of the transfer gate, for applying a first power supply voltage to the first terminal of the transfer gate; a second capacitor having a first terminal and a second terminal, for storing charges and boosting a gate voltage of the transfer gate, the first terminal of the second capacitor being connected to the second terminal of the first capacitor and the second terminal of the second capacitor being connected to the control terminal of the transfer gate; a switching unit having a first terminal, a second terminal, and a control terminal, the first terminal of the switching unit being connected to the first terminal of the second capacitor, the second terminal of the switching unit being connected to a second power supply line, and the control terminal of the switching unit being supplied with a second signal and; a precharged circuit, connected to the control terminal of the transfer gate, for applying a specific high voltage to the control terminal of the transfer gate when the transfer gate is switched OFF, wherein the precharged circuit of the first booster unit is controlled by a voltage of the first terminal of the transfer gate of the second booster unit and the precharge circuit of the second booster unit is controlled by a voltage of the first terminal of the transfer gate of the first booster unit.

The semiconductor memory may be a dynamic random access memory (DRAM) or an erasable programmable read only memory (EPROM).

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the present invention, the problems in the prior art will be explained with reference to FIGS. 1 and 2.

Figure 1:
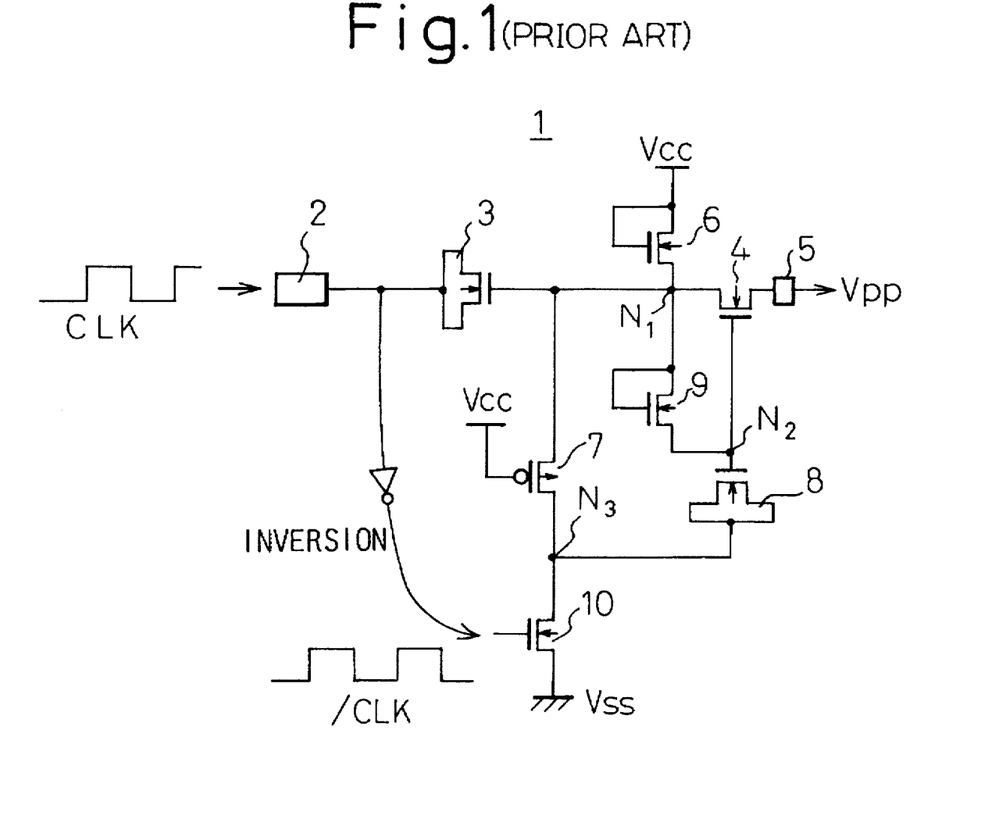
FIG. 1 is a circuit diagram showing an example of a charge-pump type booster circuit according to a prior art.

FIG. 1 shows an example of a charge-pump type booster circuit according to a prior art. In FIG. 1, reference numeral 1 denotes a charge-pump type booster circuit, 2 denotes an input terminal (input terminal), 3 denotes a first capacitor, 4 denotes a transfer gate, and 5 denotes an output terminal (output terminal). Further, reference numeral 6 denotes a power source applying unit, 7 denotes a control unit, 8 denotes a second capacitor, 9 denotes a resistor unit, and 10 denotes a switch unit.

As shown in FIG. 1, the charge-pump type booster circuit 1 comprises a plurality of N-channel type MOS transistors (3, 4, 6, 8, 9, 10) and a P-channel type MOS transistor (7). Namely, each of the first capacitor 3, the transfer gate 4, the power source applying unit 6, the second capacitor 8, the resistor unit 9, and the switch unit 10 is constituted by an N-channel type MOS transistor, and the control unit 7 is constituted by a P-channel type MOS transistor.

An end of the first capacitor 3 (source and drain electrodes of the transistor 3) is connected to the input terminal 2, and the other end (gate electrode of the transistor 3: node $N_1$) of the first capacitor 3 is connected to the output terminal 5 through the transfer gate 4. The power source applying unit 6 is connected between a high power supply line (first power supply line) Vcc and the node $N_1$(the other end of the first capacitor 3). An end of the second capacitor 8 (source and drain electrodes of the transistor 8: node $N_3$) is connected to the node $N_1$ through the control unit 7, and the other end (gate electrode of the transistor 8) of the second capacitor 8 is directly connected to the gate electrode of the transfer gate 4 and connected to the node $N_1$ through the resistor unit 9.

Note that, the input terminal 2 is supplied with a clock signal CLK. Further, the switch unit 10 is connected between the node $N_3$ and a low power supply line (second power supply line) Vss, and a gate electrode of the switch unit 10 is supplied with an inverted signal (/CLK) of the clock signal CLK. Namely, the switch unit 10 is controlled in response to the clock signal CLK (inverted clock signal/CLK) supplied to the input terminal 2.

Figure 2:
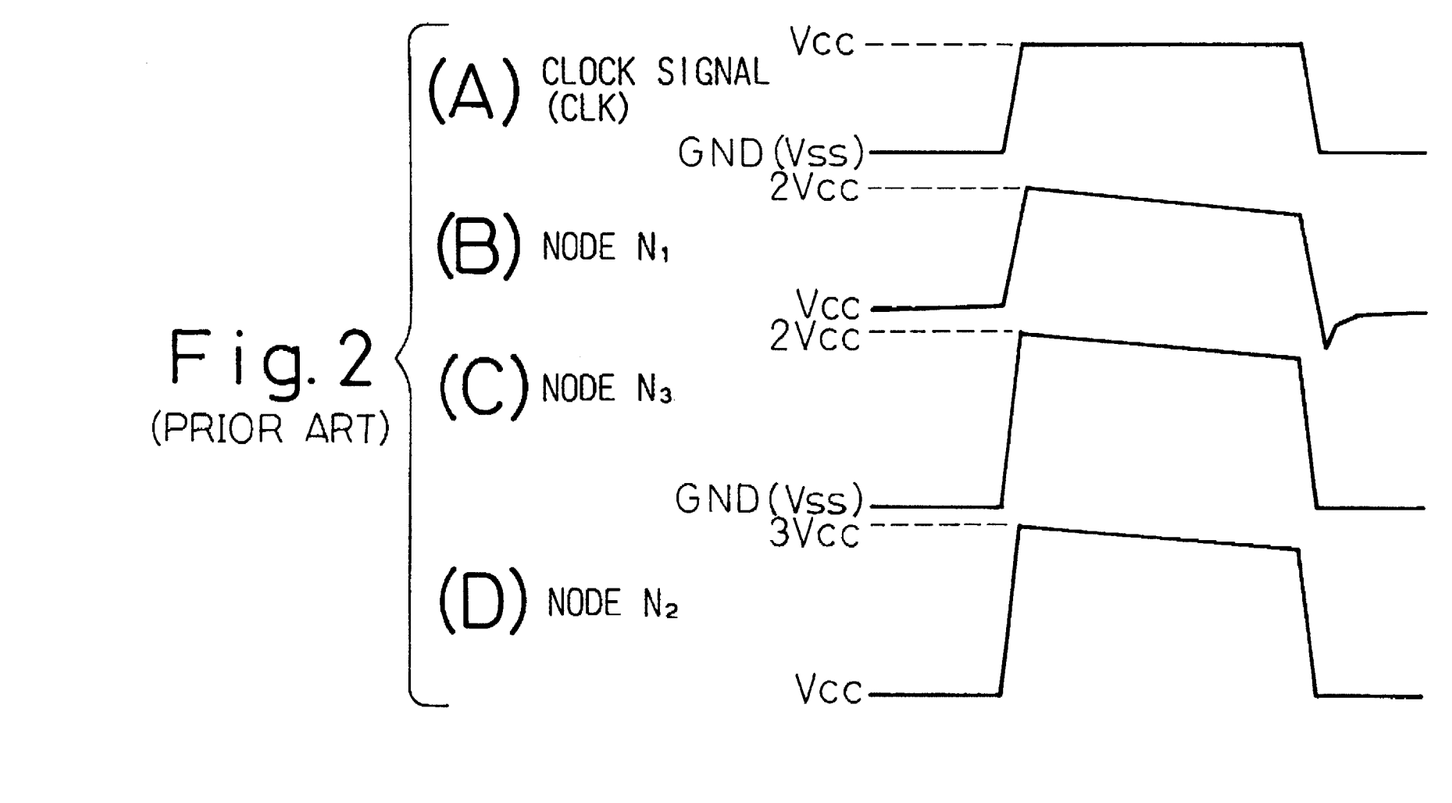
FIG. 2 is a diagram showing voltage waveforms of various portions in the booster circuit of FIG. 1.

FIG. 2 shows voltage waveforms of various portions in the booster circuit of FIG. 1. Namely, in FIG. 2, reference (A) denotes a voltage waveform of the clock signal CLK, (B) denotes a voltage waveform of the node $N_1$, (C) denotes a voltage waveform of the node $N_3$, and (D) denotes a voltage waveform of the node $N_2$.

As shown in FIG. 2(A), the voltage level of the clock signal CLK supplied to the input terminal 2 is set to vary between the high power supply voltage (general high power supply voltage: for example, 3 volts) Vcc and the low power supply voltage GND (Vss: for example, 0 volts). In this case, a potential of the node $N_1$ changes between a double power supply voltage (two times the general high power supply voltage: for example, 6 volts) 2 Vcc and the general high power supply voltage Vcc (with reference to FIG. 2(B)), and a potential of the node $N_3$ changes between the double power supply voltage 2 Vcc and the low power supply voltage GND (with reference to FIG. 2(C)). Further, a potential of the node $N_2$ changes between three times the general high power supply voltage 3 Vcc and the general high power supply voltage Vcc (with reference to FIG. 2(D)).

In the conventional charge-pump type booster circuit shown in FIG. 1, the transfer gate 4 is constituted by an N-channel type MOS transistor, and when the output of the booster circuit (output terminal 5) must provide a super-high power source voltage Vpp (for example, 6 volts (2 Vcc), or 5 volts), the gate voltage (node $N_2$) of the transfer gate 4 must be greater than the sum (Vpp+Vth) of the super-high power voltage (output voltage) Vpp and a threshold voltage Vth of the transistor (transfer gate) 4. However, the gate voltage of the transfer gate 4 cannot be brought to the required voltage. Namely, when the transfer gate 4 is switched OFF, the gate voltage of the transfer gate 4 cannot be brought to the general high power supply voltage Vcc. Therefore, when the charge of the second capacitor 8 is applied to the gate voltage of the transfer gate 4, or when the transfer gate 4 is turned ON, the gate voltage of the transfer gate 4 cannot be sufficiently increased.

Note that, the threshold voltage Vth of the transistor (transfer gate) 4 is increased in response to an increase in the output voltage Vpp of the booster circuit 1, which is caused by a back-gate effect of the MOS transistor (transfer gate 4). Consequently, the output voltage (Vpp) of the booster circuit 1, which is changed in response to the threshold voltage Vth of the transistor 4, cannot be brought to a sufficient super high voltage (Vpp).

Further, in the above prior art booster circuit, the timing of turning ON the first capacitor 3 must be equal to the timing of turning ON the second capacitor 8 connected to the transfer gate 4. If the output of the second capacitor 8 is turned ON (charge-up state) when the output of the first capacitor 3 is OFF (floating state), the transfer gate 4 will be turned ON to pass an unwanted current therethrough.

Next, preferred embodiments of a charge-pump type booster circuit according to the present invention will be explained in detail, with reference to the accompanying drawings.

Figure 3:
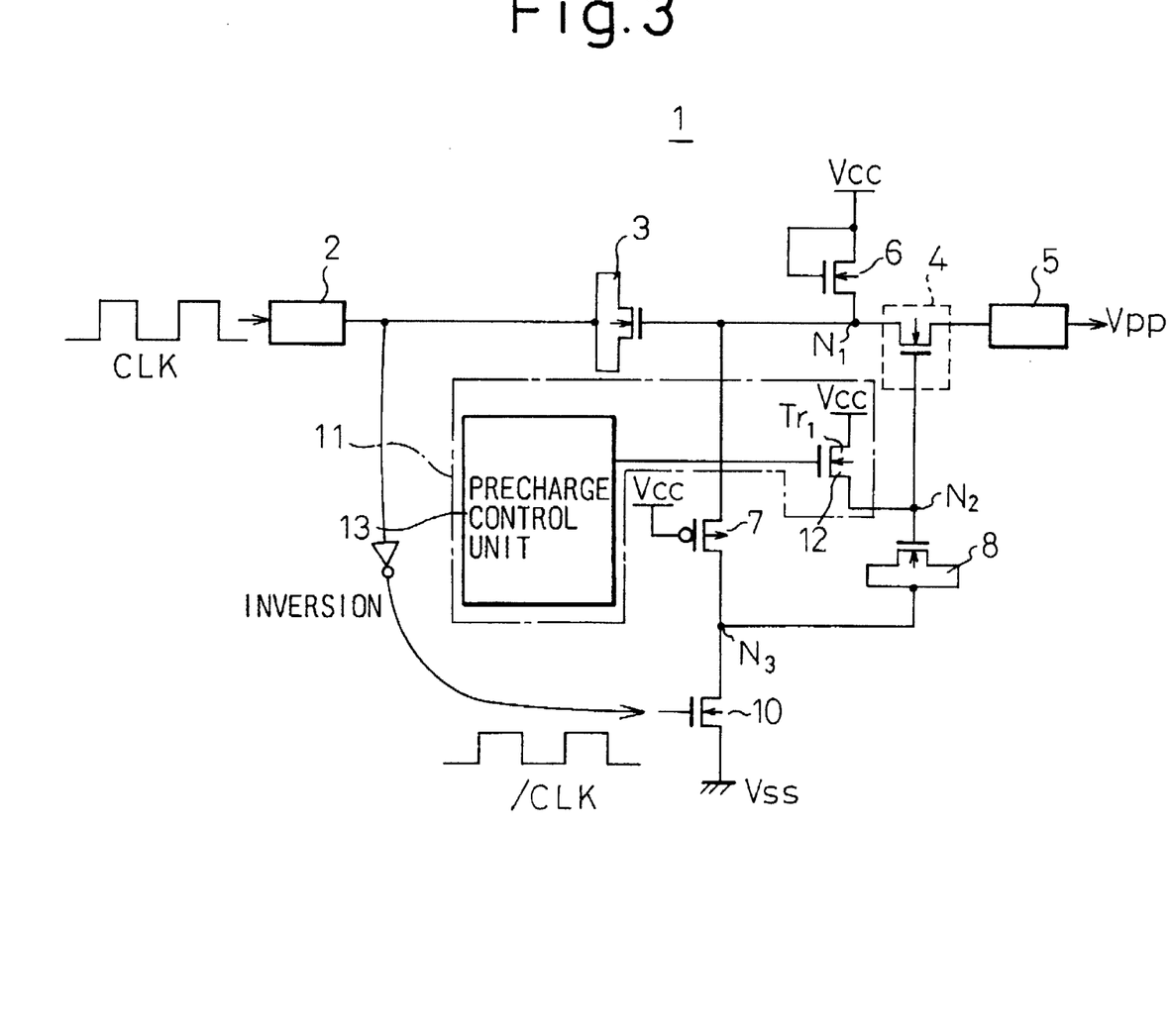
FIG. 3 is a circuit diagram showing a principle configuration of a charge-pump type booster circuit according to the present invention.

FIG. 3 shows a principle configuration of a charge-pump type booster circuit according to the present invention. In FIG. 3, reference numeral 1 denotes a charge-pump type booster circuit, 2 denotes an input terminal (input terminal), 3 denotes a first capacitor, 4 denotes a transfer gate, and 5 denotes an output terminal (output terminal). Further, reference numeral 6 denotes a power source applying unit, 7 denotes a control unit, 8 denotes a second capacitor, and 10 denotes a switch unit. In addition, reference numeral 11 denotes a precharge circuit, 12 denotes a precharge transistor, and 13 denotes a precharge control unit.

By comparing the booster circuit of FIG. 1 with that of FIG. 3, in the booster circuit of the present invention, the resistor unit 9 is deleted from the conventional booster circuit of FIG. 1, and a precharge circuit 11 is added thereto.

Namely, the charge-pump type booster circuit 1 of our invention comprises an input terminal 2, a first capacitor 3, a transfer gate 4, an output terminal 5, a power source applying unit 6, a control unit 7, a second capacitor 8, a switch unit 10, and the precharge circuit 11 having a precharge transistor 12 and a precharge control unit 13. Note that, each of the first capacitor 3, the transfer gate 4, the power source applying unit 6, the second capacitor 8, the switch unit 10, and the precharge transistor 12 is constituted by an N-channel type MOS transistor, and the control unit 7 is constituted by a P-channel type MOS transistor.

The input terminal 2 receives a first signal (clock signal CLK), and the output terminal 5 is used to output a boosted output voltage (Vpp). The first capacitor 3 has a first terminal (source and drain electrodes of the MOS transistor) and a second terminal (gate electrode of the MOS transistor), and this first capacitor 3 is used to store charges and boost an output voltage.

The transfer gate 4, which is constituted by an N-channel type MOS transistor having a first terminal, a second terminal, and a control terminal, is used to transfer the boosted output voltage (Vpp) to the output terminal 5. The first terminal (source electrode) of the transfer gate 4 is connected to the second terminal of the first capacitor 3, and the second terminal (drain electrode) of the transfer gate 4 is connected to the output terminal 5.

The power source applying unit 6, which is connected between a first power supply line (general high power supply line Vcc) and the first terminal (node $N_1$) of the transfer gate 4, is used to apply a first power supply voltage (general high power supply voltage Vcc) to the first terminal of the transfer gate 4.

The second capacitor 8, which is constituted by an N-channel type MOS transistor having a first terminal (source and drain electrodes of the MOS transistor) and a second terminal (gate electrode of the MOS transistor), and this first capacitor 3 is used to store charges and boost a gate voltage of the transfer gate 4. The first terminal of the second capacitor 8 is connected to the second terminal of the first capacitor 3 and the second terminal of the second capacitor 8 is connected to the control terminal (node $N_3$) of the transfer gate 4.

The switching unit 10 is constituted by an N-channel type MOS transistor having a first terminal (drain electrode), a second terminal (source electrode), and a control terminal (gate electrode). The first terminal of the switching unit 10 is connected to the first terminal of the second capacitor 8, the second terminal of the switching unit 10 is connected to a second power supply line (Vss, GNE), and the control terminal of the switching unit 10 is supplied with a second signal (inverted clock signal/CLK). The precharge circuit 11 is used to apply a specific high voltage (Vcc, Vdd) to the control terminal of the transfer gate 4 when the transfer gate 4 is switched OFF.

Namely, an end of the first capacitor 3 (source and drain electrodes of the transistor 3) is connected to the input terminal 2, and the other end (gate electrode of the transistor 3: node $N_1$) of the first capacitor 3 is connected to the output terminal 5 through the transfer gate 4. The power source applying unit 6 is connected between a high power supply line (first power supply line) Vcc and the node $N_1$ (the other end of the first capacitor 3). An end of the second capacitor 8 (source and drain electrodes of the transistor 8: node $N_3$) is connected to the node $N_1$ through the control unit 7, and the other end (gate electrode of the transistor 8) of the second capacitor 8 is directly connected to the gate electrode of the transfer gate 4 and connected to the high power supply line Vcc through the precharge transistor 12 ($Tr_1$). A gate electrode of the precharge transistor 12 is supplied with an output signal of the precharge control unit 13.

Note that, the input terminal 2 is supplied with a clock signal CLK. Further, the switch unit 10 is connected between the node $N_3$ and a low power supply line (second power supply line) Vss, and a gate electrode of the switch unit 10 is supplied with an inverted signal (/CLK) of the clock signal CLK. Namely, the switch unit 10 is controlled in response to the clock signal CLK (inverted clock signal/CLK) supplied to the input terminal 2.

As shown in FIG. 3, in the charge-pump type booster circuit 1 of the present invention, a gate electrode of the transfer gate 4 is connected to a precharge circuit 11 (drain electrode of the precharge transistor 12), which fixes a voltage applied to the gate electrode of the transfer gate 4 to a potential of an external power source (general high power supply voltage Vcc) or to a potential of a proper internal power source (for example, highest internal power source voltage Vdd).

Note that, the capacitors 2 and 8 are not particularly limited, and they are, for example, MOS capacitors made of N-channel type MOS transistors. The control unit is, for example, a P-channel type MOS transistor whose control terminal (gate electrode) is connected to the general high power supply line (external power source line) Vcc.

As described above, according to the charge-pump type booster circuit, the external power source is set at a general high power supply voltage Vcc, and a clock signal CLK applied to the booster circuit 1 is set to vary between the high power supply voltage (general high power supply voltage: for example, 3 volts) Vcc and the low power supply voltage GND (Vss: for example, 0 volts), with reference to FIG. 2(A).

The precharge circuit 11 fixes the gate voltage of the transfer gate 4 (node $N_2$) to a predetermined voltage while the transfer gate 4 is OFF. The switch unit 10 is controlled in response to the input clock signal CLK (inverted clock signal/CLK).

The precharge control unit 13 is used to control the control terminal voltage (gate voltage) of the precharge transistor 12. An end (source electrode) of the transistor 12 is connected to the external power source (general high power supply line) Vcc or to a specific internal power source voltage. The other end of the transistor 12 is connected to the gate electrode of the transfer gate 4 (node $N_2$). The control unit 13 drives the precharge transistor 12 to fix the gate voltage of the transfer gate 4 to the general high power supply voltage (external power source voltage) Vcc or to the specific internal power source voltage. Note that, the specific internal power source voltage is a voltage used for another purpose in a circuit (for example, a memory circuit) employing the booster circuit 1, and the specific internal power source voltage is , for example, a highest internal power source voltage Vdd.

In this way, the charge-pump type booster circuit 1 of the present invention turns ON/OFF the transfer gate 4, which is arranged at the end of the booster circuit 1, by a pumping operation. When the transfer gate 4 is OFF, the gate electrode thereof is precharged to the external power source voltage Vcc (for example, 3 volts) or to the highest internal power source voltage Vdd (for example, 2 volts).

In the booster circuit 1 of the present invention shown in FIG. 3, when the transfer gate 4 is switched OFF, the precharge transistor 12 of the precharge circuit 11 is turned ON to precharge the gate voltage of the transfer gate 4 to the general high power supply voltage Vcc. Namely, in the booster circuit 1 of FIG. 3, the gate voltage of the transfer gate 4 is sufficiently increased, and the transfer gate 4 is surely switched ON. Therefore, the booster circuit of FIG. 3 can generate a sufficient high-voltage output (super-high power supply voltage Vpp) by using a low voltage (general high power supply voltage Vcc).

Note that, the above booster circuit of the present invention can also prevent a through current or a counter current while the transfer gate 4 is OFF. Namely, the timing of turning ON the first capacitor 3 may be shifted from the timing of turning ON the second capacitor 8 for applying potential to the transfer gate. Accordingly, the node (booster node) $N_1$ will never be conductive to the output terminal 5, nor will the transfer gate 4 keep an ON state if the transfer gate 4 is turned OFF.

Figure 4:
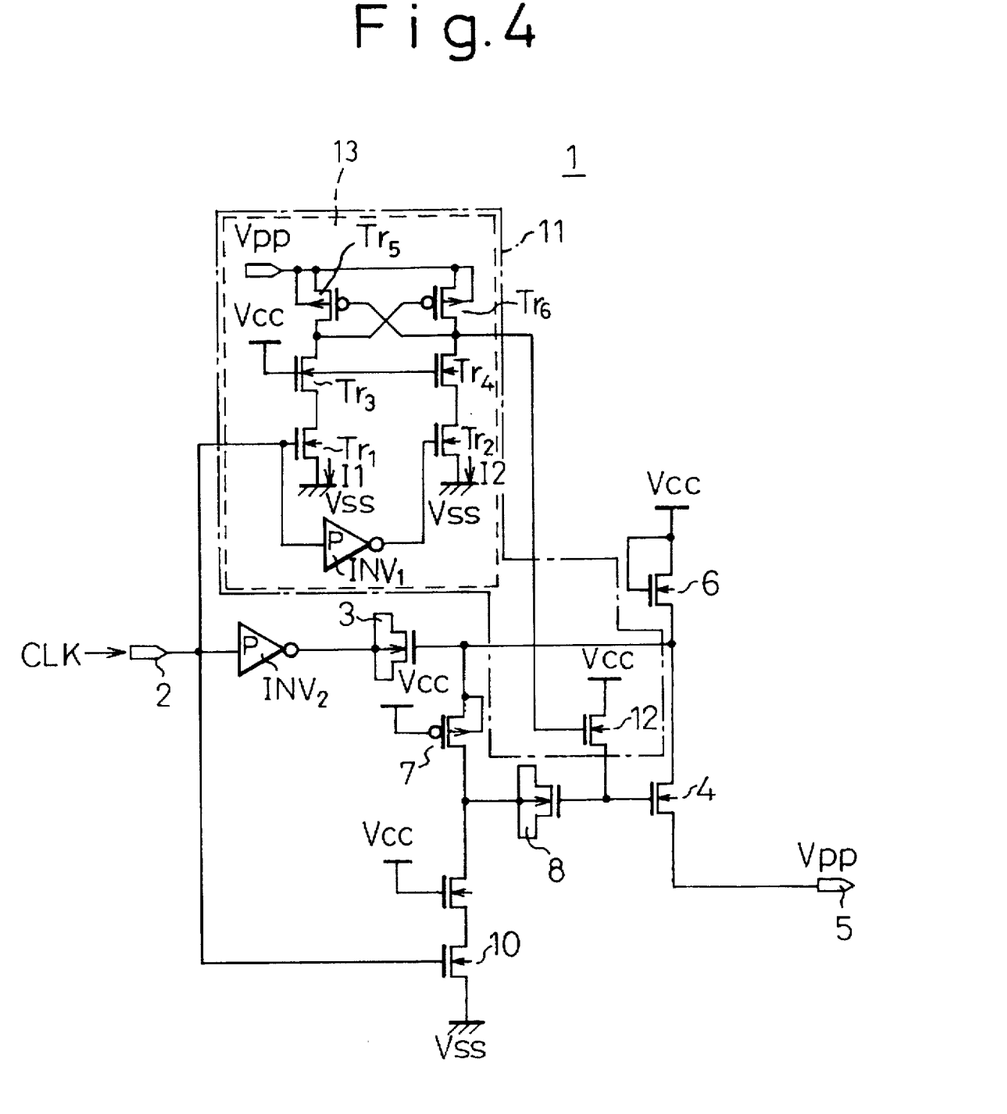
FIG. 4 is a circuit diagram showing an embodiment of a charge-pump type booster circuit according to the present invention.

FIG. 4 shows an embodiment of a charge-pump type booster circuit according to the present invention. In FIG. 4, an example of the precharge control unit 13 in the precharge circuit 11 according to the present invention is described in detail.

The precharge control unit 13 employs a known level converter to control the gate voltage of the precharge transistor 12 of the precharge circuit 11.

Between an external power source (super-high power supply voltage, or boosted voltage) Vpp and the ground GND (low power supply line Vss), there are first and second current paths I1 and I2 arranged in parallel with each other. The first current path I1 involves a P-channel type MOS transistor $Tr_5$, an N-channel type MOS transistor $Tr_3$, and an N-channel type MOS transistor $Tr_1$ connected in series. Similarly, the second current path I2 involves a P-channel type MOS transistor $Tr_6$, an N-channel type MOS transistor $Tr_4$, and an N-channel type MOS transistor $Tr_2$ connected in series.

An input clock signal CLK to the input terminal 2 is supplied to the gate electrode of the transistor $Tr_1$, as well as to the gate electrode of the transistor $Tr_2$ through an inverter $INV_1$. The gate electrodes of the transistors $Tr_3$ and $Tr_4$ are commonly connected to the general high power supply line (external power source voltage) Vcc. The source electrode of the transistor $Tr_3$ is connected to the gate electrode of the transistor $Tr_6$. The source electrode of the transistor $Tr_4$ is connected to the gate electrode of the transistor $Tr_5$ as well as to the gate electrode of the precharge transistor 12.

An inverter $INV_2$ is arranged between and connected to the input terminal 2 and first capacitor 3. The potential of the external power source (super-high power supply voltage) Vpp is set to be higher than the potential of the external power source voltage (general high power supply voltage) Vcc. The potential of the input to the level converter is changed between the low power supply voltage (Vss: 0 volts) and the general high power supply voltage (Vcc: 3 volts), and the potential of the output thereof is changed between the low power supply voltage Vss (0 volts) and the super-high power supply voltage Vpp (6 volts).

As explained above, the gate voltage of the precharge transistor 12 is always set to the super-high power supply voltage (Vpp) when the transfer gate 4 is turned OFF. Accordingly, the gate voltage of the transfer gate 4 is precharged to the general high power supply voltage (Vcc) due to the ON operation of the precharge transistor 12.

Figure 5:
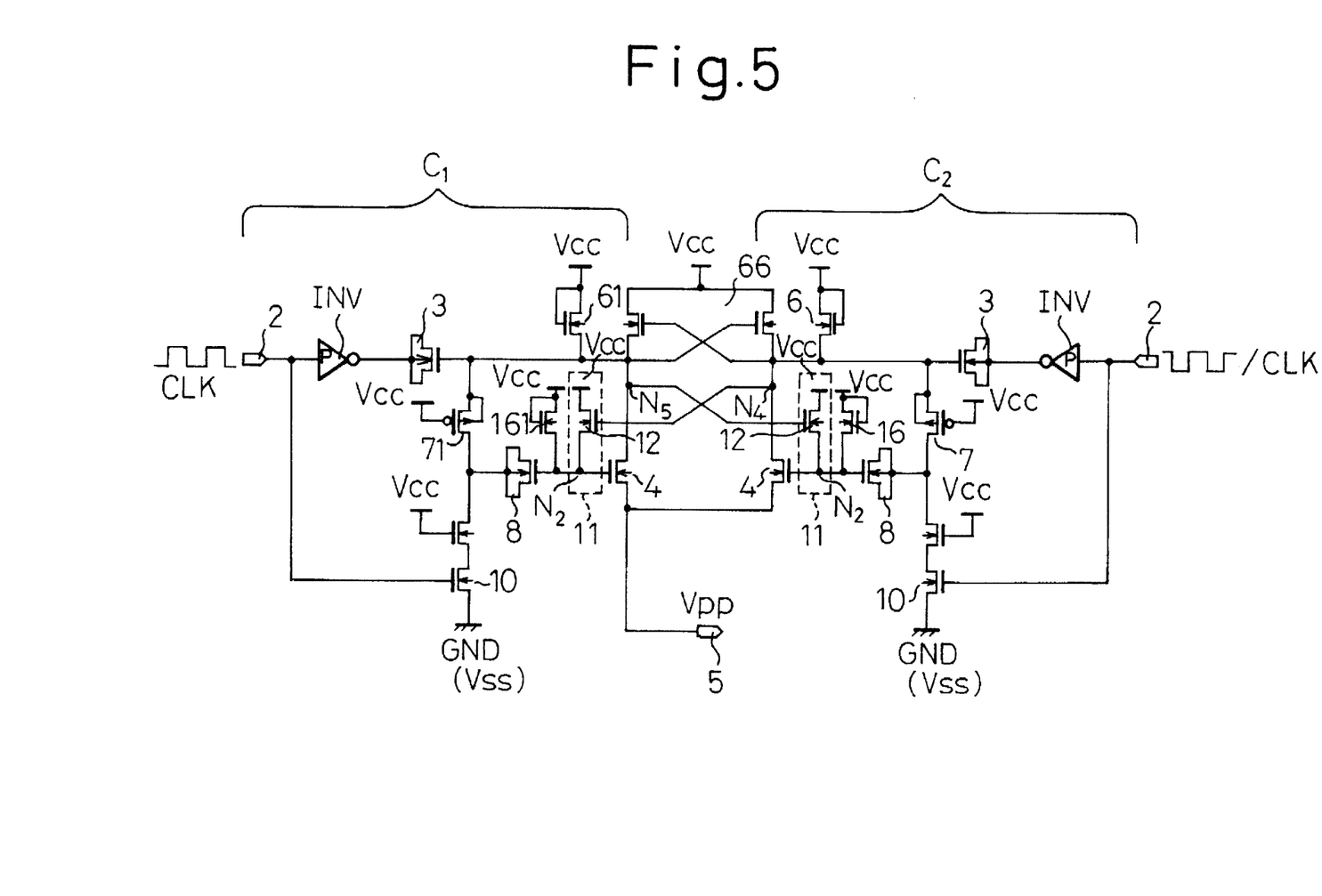
FIG. 5 is a circuit diagram showing another embodiment of a charge-pump type booster circuit according to the present invention.

FIG. 5 shows another embodiment of a charge-pump type booster circuit according to the present invention.

As shown in FIG. 5, another embodiment of the charge-pump type booster circuit comprises two ($C_1$ and $C_2$) of the circuits shown in FIG. 3. A precharge transistor 12 of one of the circuits is controlled by the voltage of a booster node (node $N_4$ or $N_5$) of the other circuit. Clock signals supplied to the two circuits must have opposite phases. Namely, the clock signal CLK is supplied to the input terminal 2 of the circuit $C_1$, and the inverted clock signal /CLK is supplied to the input terminal 2 of the circuit $C_2$.

A gate electrode of the precharge transistor 12 of one of the circuits is connected to the booster node (node $N_4$ or $N_5$) of the other circuit that operates with a clock signal of opposite phase.

As shown in FIG. 5, the booster circuit comprises the first and second circuits $C_1$ and $C_2$ arranged side by side and having an identical structure. Each of the first and second circuits $C_1$ and $C_2$ includes an input terminal 2, a first capacitor 3 connected to the input terminal 2, a transfer gate 4 connected to the first capacitor 3, an output terminal connected to the transfer gate 4, an external power source 6 arranged between and connected to the transfer gate 4 and first capacitor 3, a second capacitor 8 having one terminal connected to a gate electrode of the transfer gate 4 and another terminal connected to the first capacitor 3 through a proper controller 7, and a precharge circuit 11 connected to the gate electrode of the transfer gate 4, to precharge a voltage applied to the gate to the potential of the external power source or of a proper internal power source (for example, the highest internal power source).

The output terminal 5 is shared by the transfer gates 4 of the first and second circuits $C_1$ and $C_2$. A control terminal of the precharged circuit 11 of the first circuit $C_1$ is connected to a terminal of the transfer gate 4 of the second circuit $C_2$ opposite to the terminal thereof connected to the output terminal 5. A control terminal of the precharge circuit 11 of the second circuit $C_2$ is connected to a terminal of the transfer gate 4 of the first circuit $C_1$ opposite to the terminal thereof connected to the output terminal 5.

A node between the transfer gate 4 and external power source 6 of the first circuit $c_1$ is connected to a terminal of a transistor whose second terminal is connected to an external power source 66 and whose control terminal is connected to a node between the transfer gate 4 and external power source 6 of the second circuit $C_2$. The node between the transfer gate 4 and external power source 6 of the second circuit $C_2$ is connected to a terminal of a transistor whose second terminal is connected to the external power source 66 and whose control terminal is connected to the node between the transfer gate 4 and external gate 6 of the first circuit $C_1$. The input terminal 2 of each of the first and second circuits $C_1$ and $C_2$ is connected to an inverter INV. The input terminals 2 of the first and second circuits $C_1$ and $C_2$ receive clock signals having different phases, respectively.

The operation of each of the circuits $C_1$ and $C_2$ is basically the same as that of the semiconductor integrated circuit of FIG. 3. What is different is that the control gate terminal of the precharge transistor 12 of the precharge circuit 11 of the circuit $C_1$ is controlled by the potential of the node $N_4$ of the other circuit $C_2$. Similarly, the control gate terminal of the precharge transistor 12 of the precharge circuit 11 of the circuit $C_2$ is controlled by the potential of the node $N_5$ of the circuit $C_1$.

When the clock signal CLK supplied to the input terminal 2 of the first circuit $C_1$ is at a high level "H" (general high power supply voltage Vcc), the gate voltage (node $N_2$) of the transfer gate 4 of the first circuit $C_1$ is at Vcc. At this time, the potential of the node $N_4$ of the second circuit $C_2$ is at 2 Vcc, to turn ON the precharge transistor 12 of the precharge circuit 11 in the first circuit $C_1$, to thereby precharge the node $N_2$ for the transfer gate 4 of the first circuit $C_1$ to be at Vcc.

When the clock signal CLK supplied to the input terminal 2 of the first circuit $C_1$ is at low level "L" (low power supply voltage Vss or GND), the gate potential $N_2$ of the transfer gate 4 in the first circuit $C_1$ is at 2 Vcc, to carry out a normal operation. At this time, the potential of the node $N_4$ of the second circuit $C_2$ is precharged to Vcc. Accordingly, the precharge transistor 12 of the precharge circuit 11 in the first circuit $C_1$ is turned OFF.

On the other hand, the potential of the node $N_5$ of the first circuit $C_1$ is set to 2 Vcc, which is applied to the gate electrode of the precharge transistor 12 of the precharge circuit 11 in the second circuit $C_2$. Accordingly, the precharge circuit 11 of the second circuit $C_2$ is turned ON, and the gate potential $N_2$ of the transfer gate 4 of the second circuit $C_2$ is precharged to Vcc.

In this way, this embodiment controls the controller of the precharge transistor of FIG. 3 according to the potential of the booster node (node $N_4$ or $N_5$).

In the former embodiment shown in FIG. 4, the precharge transistor 12 connected to the gate electrode of the transfer gate 4 is turned ON with the use of the boosted power source voltage Vpp. On the other hand, the latter embodiment shown in FIG. 5 uses the booster node (node $N_4$ or $N_5$) of the other circuit ($C_2$ or $C_1$) as an input to the precharge control circuit 11, to effectively prevent a through current.

The above embodiment may have a floating prevention unit 16. In each of the first and second circuits $C_1$ and $C_2$, the floating prevention unit 16 is connected to the node $N_2$ between the second capacitor 8 and the precharge circuit 11. This unit 16 may be a transistor. When the semiconductor integrated circuit (booster circuit) is not used for a long time, the node $N_2$ of each of the circuits $C_1$ and $C_2$ will be discharged. The floating prevention unit 16 keeps the charges in the circuit, to prepare for the restart of the circuit.

Figure 6:
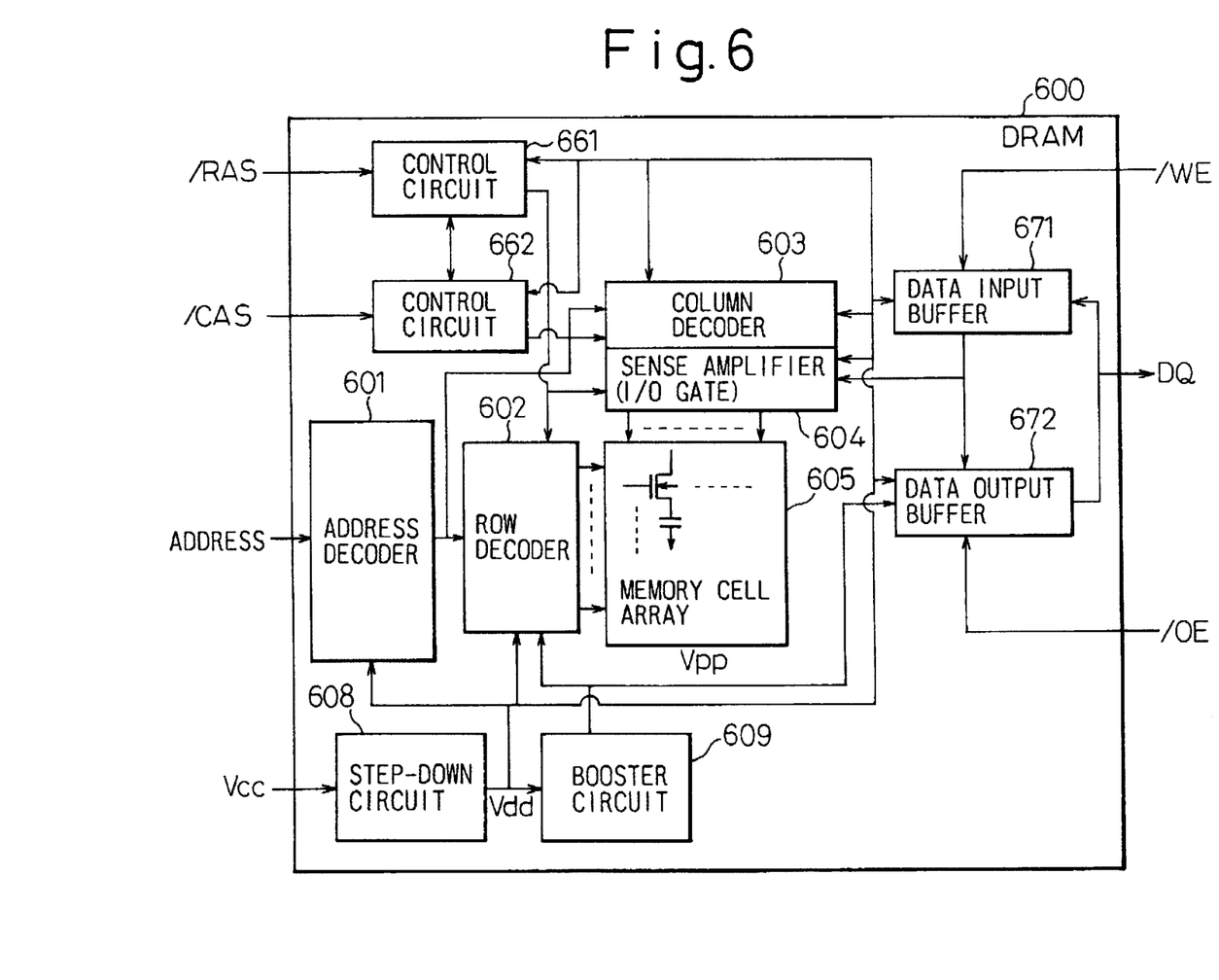
FIG. 6 is a block diagram showing a dynamic random access memory (DRAM) employing the booster circuit of the present invention.

FIG. 6 shows a dynamic random access memory (DRAM) employing the booster circuit of the present invention.

The charge-pump type booster circuit of the present invention is, for example, employed as a booster circuit 609 in a DRAM shown in FIG. 6 to generate a super-high power source voltage Vpp for applying to the word lines thereof.

As shown in FIG. 6, a DRAM 600 comprises an address decoder 601, a row decoder 602, a column decoder 603, a sense amplifier (I/O gate) 604, a memory cell array 605, control circuits 661 and 662, a data input buffer 671, a data output buffer 672, a step-down circuit 608, and a booster circuit 609 corresponding to the charge-pump type booster circuit of our invention.

The address decoder 601 receives and decodes an address signal, and accesses a specific memory cell in the memory cell array 605 corresponding to the address signal by using the row decoder 602 and the column decoder 603. Namely, the row decoder 602 selects a specific word line in accordance with a row address signal supplied from the address decoder 601, and the column decoder 603 selects a specific bit line through the sense amplifier (I/O gate) 604 in response to a column address signal supplied from the address decoder 601. Note that, in the memory cell array 605, a plurality of word lines and a plurality of bit lines are provided, and further, a plurality of memory cells are each positioned at the intersection portion of each of the word lines and bit lines.

The control circuit 661 receives a row address strobe signal (/RAS) and the control circuit 662 receives a column address strobe signal (/CAS), and these control circuits 661 and 662 control the operation of the DRAM. The data input buffer 671 receives a write enable signal (/WE), and write data are supplied from the external (data bus) to the sense amplifier (I/O gate) 604 through the data input buffer 671. The data output buffer 672 receives an output enable signal (/OE), and read data are supplied from the sense amplifier (I/O gate) 604 to the external (data bus) through the data output buffer 672.

As shown in FIG. 6, in the DRAM, the step-down circuit 608 and the booster circuit (step-up circuit) 609 are provided. The step-down circuit 608 is used to generate an internal power source voltage (highest internal power source voltage Vdd: for example, 2 volts) lower than the general high power supply voltage (Vcc: for example, 3 volts), and the booster circuit 609 is used to generate an internal power source voltage (super-high power source voltage Vpp: for example, 6 volts) higher than the general high power supply voltage (Vcc). Note that, the super-high power source voltage Vpp is, for example, used to drive the word line of the memory cell array 605, and the like. Further, this DRAM is, for example, provided in a battery-operated portable equipment (battery-operated note-book-type portable computer), and the booster circuit 609 (charge-pump type booster circuit 1 of the present invention) is used to boost the external voltage (battery voltage) Vcc to the super-high power source voltage Vpp.

Figure 7:
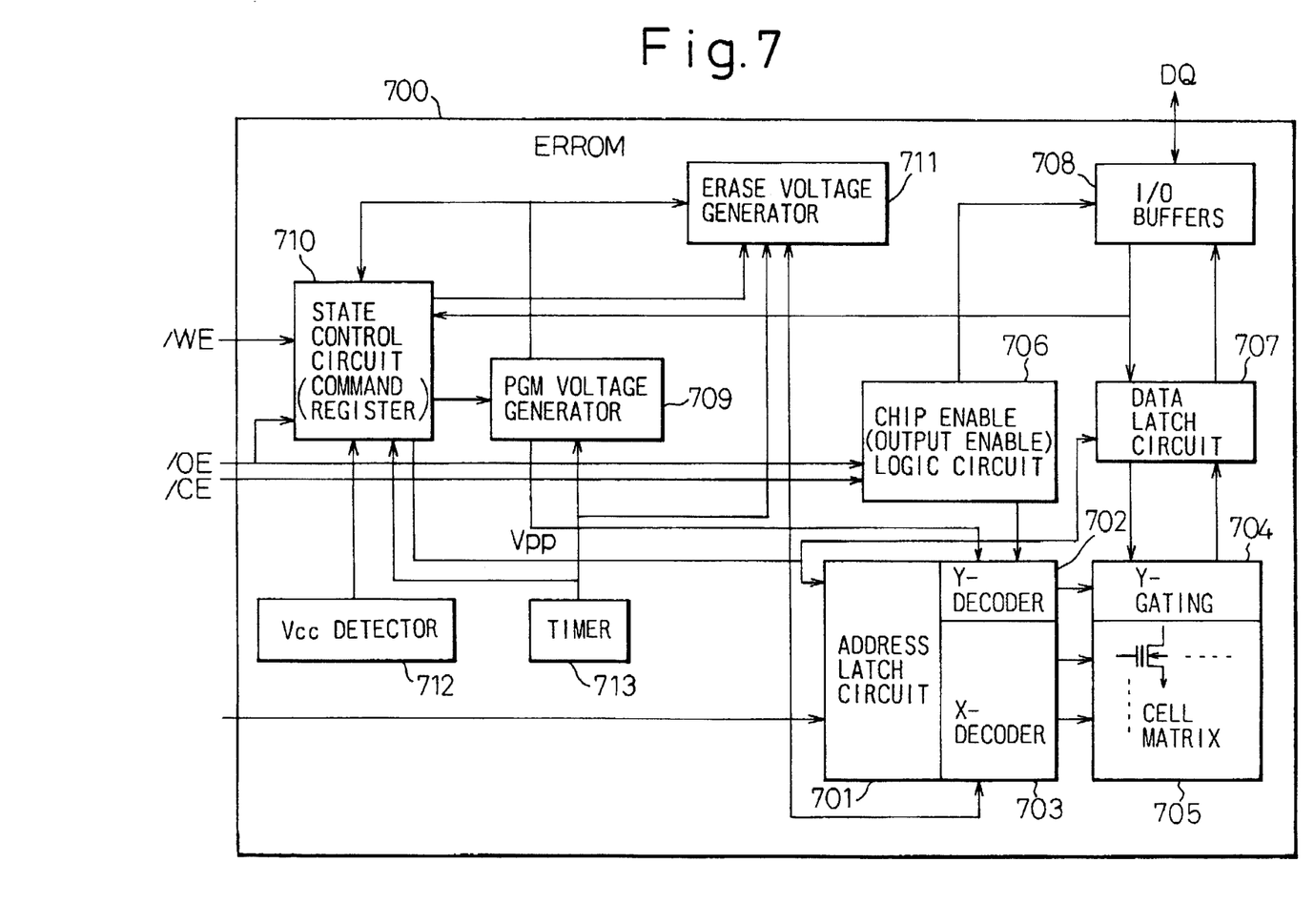
FIG. 7 is a block diagram showing an erasable programmable read only memory (EPROM) employing the booster circuit of the present invention.

FIG. 7 shows an erasable programmable read only memory (EPROM) employing the booster circuit of the present invention.

The charge-pump type booster circuit of the present invention is, for example, employed as a PGM voltage generator 709 in an EPROM shown in FIG. 7 to generate a super-high power source voltage Vpp for applying a Y-decoder 702.

As shown in FIG. 7, an EPROM 700 comprises an address latch circuit (address decoder) 701, a Y-decoder (column decoder) 702, an X-decoder (row decoder) 703, a Y-gating 704, a cell matrix (memory cell array) 705, a chip enable (output enable) logic circuit 706, a data latch circuit 707, an I/O buffers 708, a PGM voltage generator 709, a state control circuit (command register) 710, an erase voltage generator 711, a Vcc detector 712, and a timer 713.

The address latch 701 receives and decodes an address signal, and accesses a specific memory cell in the cell matrix 705 corresponding to the address signal by using the Y-decoder 702 and the X-decoder 703. Namely, the X-decoder 703 selects a specific word line in accordance with an X-address signal supplied from the address latch 701, and the Y-decoder 702 selects a specific bit line through the Y-gating 704 in response to a Y-address signal supplied from the address latch 701.

The chip enable (output enable) logic circuit 706 receives an output enable signal (/OE) and a chip enable signal (/CE), and control the Y-decoder 702 and the I/O buffers 708. The data latch 707 stores data (read or write data), and the data are transferred through the I/O buffers 708. The PGM voltage generator 709 corresponding to the charge-pump type booster circuit of the present invention generates a super-high power source voltage Vpp, and the super-high power source voltage Vpp is applied to the Y-decoder 702 and used to write (program) data into memory cells. Namely, when a programming operation of the EPROM is carried out, the super-high power source voltage Vpp, which is an output voltage of the PGM voltage generator 709, is used.

The state control circuit (command register) 710 receives a write enable signal (/WE) and the output enable signal (/OE), and controls the state (reading state or programming state) of the EPROM. The erase voltage generator 711 generates an erase voltage, and the Vcc detector 712 detects the general high power supply voltage Vcc. The timer 713 counts a time, and generates and provides timing signals to the PGM voltage generator 709 and the state control circuit (command register) 710.

Note that, the charge-pump type booster circuit of the present invention cannot only be employed in a DRAM or an EPROM, but may also be employed in various semiconductor devices, or electronic circuits.

As explained above, according to a charge-pump type booster circuit of the present invention, a sufficient high-voltage output (super-high power supply voltage Vpp) can be surely generated by using a low voltage (general high power supply voltage Vcc). Further, according to a charge-pump type booster circuit of the present invention, an unwanted current can be prevented. Namely, it is not necessary to precisely control the timing of changing the output potential of the first capacitor (booster capacitor) and the timing of changing the output potential of the second capacitor connected to the gate electrode of the transfer gate.

Many different embodiments of the present invention may be constructed without departing from the spirit and scope of the present invention, and it should be understood that the present invention is not limited to the specific embodiments described in this specification, except as defined in the appended claims.

What is claimed is:

1. A charge-pump type booster circuit comprising:
   a first capacitor for boosting an output voltage;
   a power source applying unit for applying a first power supply voltage to an output terminal of said first capacitor;
   a transfer gate for transferring the boosted output voltage;
   a second capacitor for boosting a gate voltage of said transfer gate;
   a switching unit for controlling an input voltage of said second capacitor; and
   a precharge circuit for applying a specific high voltage to a control terminal of said transfer gate, wherein said precharge circuit comprises:
      a precharge transistor connected between a specific high voltage line and the control terminal of said transfer gate; and
      a precharge control unit for controlling a switching operation of said precharge transistor, a power source voltage of said precharge control unit being the boosted output voltage of said charge-pump type booster circuit.

2. A charge-pump booster circuit as claimed in claim 1, wherein said precharge control unit comprises a level converter.

3. A charge-pump type booster circuit as claimed in claim 1, wherein said booster circuit further comprises a control unit connected between the output terminal of said first capacitor and an input terminal of said second capacitor.

4. A charge-pump booster circuit as claimed in claim 3, wherein said control unit comprises a transistor having a control terminal which is connected to a first power supply line.

5. A charge-pump type booster circuit as claimed in claim 1, wherein the specific high voltage is a voltage of a first power supply line.

6. A charge-pump type booster circuit as claimed in claim 1, wherein each of said first and second capacitors comprises a MOS transistor.

7. A charge-pump type booster circuit as claimed in claim 1, wherein an input terminal of said first capacitor is supplied with a clock signal, and a control terminal of said switching unit is supplied with an inverted signal of the clock signal.

8. A charge-pump type booster circuit as claimed in claim 1, wherein said booster circuit further comprises a floating prevention unit for keeping charges and preventing a floating state from occurring at the control terminal of said transfer gate.

9. A charge-pump type booster circuit as claimed in claim 8, wherein said floating prevention unit comprises a MOS transistor connected to a first power supply line.

10. A charge-pump type booster circuit comprising:
   an input terminal for receiving a first signal;
   an output terminal for outputting a boosted output voltage;
   a first capacitor having a first terminal and a second terminal, for storing charges and boosting an output voltage, the first terminal of said first capacitor being connected to said input terminal;
   a transfer gate having a first terminal, a second terminal, and a control terminal, for transferring the boosted output voltage to said output terminal, the first terminal of said transfer gate being connected to the second terminal of said first capacitor, and the second terminal of said transfer gate being connected to said output terminal;
   a power source applying unit, connected between a first power supply line and the first terminal of said transfer gate, for applying a first power supply voltage to the first terminal of said transfer gate;
   a second capacitor having a first terminal and a second terminal, for storing charges and boosting a gate voltage of said transfer gate, the first terminal of said second capacitor being connected to the second terminal of said first capacitor and the second terminal of said second capacitor being connected to the control terminal of said transfer gate;
   a switching unit having a first terminal, a second terminal, and a control terminal, the first terminal of said switching unit being connected to the first terminal of said second capacitor, the second terminal of said switching unit being connected to a second power supply line, and the control terminal of said switching unit being supplied with a second signal and;
   a precharge circuit, connected to the control terminal of said transfer gate, for applying a specific high voltage to the control terminal of said transfer gate when said transfer gate being switched OFF, wherein said precharge circuit comprises:
      a precharge transistor having a first terminal, a second terminal, and a control terminal, the first terminal of said precharge transistor being connected to a specific high voltage line, the second terminal of said precharge transistor being connected to the control terminal of said transfer gate; and
      a precharge control unit, connected to the control terminal of said precharge transistor, for controlling a switching operation of said precharge transistor, a power source voltage of said precharge control unit being the boosted output voltage of said charge-pump type booster circuit.

11. A charge-pump type booster circuit as claimed in claim 10, wherein said precharge control unit comprises a level converter.

12. A charge-pump type booster circuit as claimed in claim 10, wherein said booster circuit further comprises a control unit connected between the second terminal of said first capacitor and the first terminal of said second capacitor.

13. A charge-pump type booster circuit as claimed in claim 12, wherein said control unit comprises a P-channel type MOS transistor having a first terminal, a second terminal, and a control terminal, the first terminal of said transistor being connected to the second terminal of said first capacitor, the second terminal of said transistor being connected to the second power supply line, and the control terminal of said transistor being connected to the first power supply line.

14. A charge-pump type booster circuit as claimed in claim 10, wherein the specific high voltage applied to the control terminal of said transfer gate is a voltage of the first power supply line.

15. A charge-pump type booster circuit as claimed in claim 10, wherein each of said first and second capacitors comprises an N-channel type MOS transistor, the first terminal of said first capacitor is constituted by a source electrode and a drain electrode of said MOS transistor, and the second terminal of said first capacitor is constituted by a gate electrode of said MOS transistor.

16. A charge-pump type booster circuit as claimed in claim 10, wherein the first signal supplied to said input terminal is a clock signal, and the second signal supplied to the control terminal of said switching unit is an inverted signal of the clock signal.

17. A charge-pump type booster circuit as claimed in claim 10, wherein said booster circuit further comprises a floating prevention unit for keeping charges and preventing a floating state from occurring at the control terminal of said transfer gate.

18. A charge-pump type booster circuit as claimed in claim 17, wherein said floating prevention unit comprises an N-channel type MOS transistor having a first terminal, a second terminal, and a control terminal, the first terminal and the control terminal of said floating prevention unit being connected to a high power supply line, and the second terminal of said floating prevention unit being connected to the control terminal of said transfer gate.

19. A charge-pump type booster circuit having a first and second booster units, each of said first and second booster units comprising:

an input terminal for receiving a first signal;

an output terminal for outputting a boosted output voltage;

a first capacitor having a first terminal and a second terminal, for storing charges and boosting an output voltage, the first terminal of said first capacitor being connected to said input terminal;

a transfer gate having a first terminal, a second terminal, and a control terminal, for transferring the boosted output voltage to said output terminal, the first terminal of said transfer gate being connected to the second terminal of said first capacitor, and the second terminal of said transfer gate being connected to said output terminal;

a power source applying unit, connected between a first power supply line and the first terminal of said transfer gate, for applying a first power supply voltage to the first terminal of said transfer gate;

a second capacitor having a first terminal and a second terminal, for storing charges and boosting a gate voltage of said transfer gate, the first terminal of said second capacitor being connected to the second terminal of said first capacitor and the second terminal of said second capacitor being connected to the control terminal of said transfer gate;

a switching unit having a first terminal, a second terminal, and a control terminal, the first terminal of said switching unit being connected to the first terminal of said second capacitor, the second terminal of said switching unit being connected to a second power supply line, and the control terminal of said switching unit being supplied with a second signal and;

a precharge circuit, connected to the control terminal of said transfer gate, for applying a specific high voltage to the control terminal of said transfer gate when said transfer gate is switched OFF, wherein the precharge circuit of said first booster unit is controlled by a voltage of the first terminal of the transfer gate of said second booster unit, the precharge circuit of said second booster unit is controlled by a voltage of the first terminal of the transfer gate of said first booster unit.

20. A charge-pump type booster circuit as claimed in claim 19, wherein said precharge circuit comprises a precharge transistor having a first terminal, a second terminal, and a control terminal, the first terminal of said precharge transistor being connected to a specific high voltage line, the second terminal of said precharge transistor being connected to the control terminal of said transfer gate; and the control terminal of said precharge transistor of said first booster unit is connected to the first terminal of the transfer gate of said second booster unit, and the control terminal of said precharge transistor of said second booster unit is connected to the first terminal of the transfer gate of said first booster unit.

21. A charge-pump type booster circuit as claimed in claim 19, wherein each of said booster units further comprises a control unit connected between the second terminal of said first capacitor and the first terminal of said second capacitor.

22. A charge-pump type booster circuit as claimed in claim 21, wherein said control unit comprises a P-channel type MOS transistor having a first terminal, a second terminal, and a control terminal, the first terminal of said transistor being connected to the second terminal of said first capacitor, the second terminal of said transistor being connected to the second power supply line, and the control terminal of said transistor being connected to the first power supply line.

23. A charge-pump type booster circuit as claimed in claim 19, wherein the specific high voltage applied to the control terminal of said transfer gate is a voltage of the first power supply line.

24. A charge-pump type booster circuit as claimed in claim 19, wherein each of said first and second capacitors comprises an N-channel type MOS transistor, the first terminal of said first capacitor is constituted by a source electrode and a drain electrode of said MOS transistor, and the second terminal of said first capacitor is constituted by a gate electrode of said MOS transistor.

25. A charge-pump type booster circuit as claimed in claim 19, wherein the first signal supplied to the input terminal of said second booster unit and the second signal supplied to the control terminal of the switching unit of said first booster unit is a clock signal, and the first signal supplied to the input terminal of said first booster unit and the second signal supplied to the control terminal of the switching unit of said second booster unit is an inverted signal of the clock signal.

26. A charge-pump type booster circuit as claimed in claim 19, wherein each of said booster units further comprises a floating prevention unit for keeping charges and preventing a floating state from occurring at the control terminal of said transfer gate.

27. A charge-pump type booster circuit as claimed in claim 26, wherein said floating prevention unit comprises an N-channel type MOS transistor having a first terminal, a second terminal, and a control terminal, the first terminal and the control terminal of said floating prevention unit being connected to a high power supply line, and the second terminal of said floating prevention unit being connected to the control terminal of said transfer gate.

28. A semiconductor memory having an address decoder, a row decoder, a column decoder, a memory cell array, and a booster circuit for generating a boosted output voltage, wherein said booster circuit comprises:

an input terminal for receiving a first signal;

an output terminal for outputting a boosted output voltage;

a first capacitor having a first terminal and a second terminal, for storing charges and boosting an output voltage, the first terminal of said first capacitor being connected to said input terminal;

a transfer gate having a first terminal, a second terminal, and a control terminal, for transferring the boosted output voltage to said output terminal, the first terminal of said transfer gate being connected to the second terminal of said first capacitor, and the second terminal of said transfer gate being connected to said output terminal;

a power source applying unit, connected between a first power supply line and the first terminal of said transfer gate, for applying a first power supply voltage to the first terminal of said transfer gate;

a second capacitor having a first terminal and a second terminal, for storing charges and boosting a gate voltage of said transfer gate, the first terminal of said second capacitor being connected to the second terminal of said first capacitor and the second terminal of said second capacitor being connected to the control terminal of said transfer gate;

a switching unit having a first terminal, a second terminal, and a control terminal, the first terminal of said switching unit being connected to the first terminal of said second capacitor, the second terminal of said switching unit being connected to a second power supply line, and the control terminal of said switching unit being supplied with a second signal and;

a precharge circuit, connected to the control terminal of said transfer gate, for applying a specific high voltage to the control terminal of said transfer gate when said transfer gate being switched OFF, wherein said precharge circuit comprises:

a precharge transistor having a first terminal, a second terminal, and a control terminal, the first terminal of said precharge transistor being connected to a specific high voltage line, the second terminal of said precharge transistor being connected to the control terminal of said transfer gate; and a precharge control unit, connected to the control terminal of said precharge transistor, for controlling a switching operation of said precharge transistor, a power source voltage of said precharge control unit being the boosted output voltage of said booster circuit.

29. A semiconductor memory as claimed in claim 28, wherein said semiconductor memory is a dynamic random access memory.

30. A semiconductor memory as claimed in claim 28, wherein said semiconductor memory is an erasable programmable read only memory.

31. A semiconductor memory having an address decoder, a row decoder, a column decoder, a memory cell array, and a booster circuit for generating a boosted output voltage, wherein said booster circuit includes first and second booster units, each of said first and second booster units comprising:

an input terminal for receiving a first signal;

an output terminal for outputting a boosted output voltage;

a first capacitor having a first terminal and a second terminal, for storing charges and boosting an output voltage, the first terminal of said first capacitor being connected to said input terminal;

a transfer gate having a first terminal, a second terminal, and a control terminal, for transferring the boosted output voltage to said output terminal, the first terminal of said transfer gate being connected to the second terminal of said first capacitor, and the second terminal of said transfer gate being connected to said output terminal;

a power source applying unit, connected between a first power supply line and the first terminal of said transfer gate, for applying a first power supply voltage to the first terminal of said transfer gate;

a second capacitor having a first terminal and a second terminal, for storing charges and boosting a gate voltage of said transfer gate, the first terminal of said second capacitor being connected to the second terminal of said first capacitor and the second terminal of said second capacitor being connected to the control terminal of said transfer gate;

a switching unit having a first terminal, a second terminal, and a control terminal, the first terminal of said switching unit being connected to the first terminal of said second capacitor, the second terminal of said switching unit being connected to a second power supply line, and the control terminal of said switching unit being supplied with a second signal and;

a precharge circuit, connected to the control terminal of said transfer gate, for applying a specific high voltage to the control terminal of said transfer gate when said transfer gate is switched OFF, wherein the precharge circuit of said first booster unit is controlled by a voltage of the first terminal of the transfer gate of said second booster unit and the precharge circuit of said second booster unit is controlled by a voltage of the first terminal of the transfer gate of said first booster unit.

32. A semiconductor memory as claimed in claim 31, wherein said semiconductor memory is a dynamic random access memory.

33. A semiconductor memory as claimed in claim 31, wherein said semiconductor memory is an erasable programmable read only memory.

* * * * *